(12) United States Patent
Sieber et al.

(10) Patent No.: US 7,041,608 B2
(45) Date of Patent: May 9, 2006

(54) PROVIDING FLUOROCARBON LAYERS ON CONDUCTIVE ELECTRODES IN MAKING ELECTRONIC DEVICES SUCH AS OLED DEVICES

(75) Inventors: Kurt D. Sieber, Rochester, NY (US); Jeremy M. Grace, Penfield, NY (US); Michael J. Heinsler, Rochester, NY (US); Jeffrey P. Spindler, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/773,744

(22) Filed: Feb. 6, 2004

(65) Prior Publication Data

US 2005/0176230 A1  Aug. 11, 2005

(51) Int. Cl.
*H01L 21/31* (2006.01)
*H01L 21/44* (2006.01)

(52) U.S. Cl. ............... 438/780; 438/608; 438/609; 438/795

(58) Field of Classification Search ............ 438/608, 438/609, 99, 795, 780
See application file for complete search history.

(56) References Cited

U.S. PATENT DOCUMENTS

| | | | |
|---|---|---|---|
| 3,172,862 A | 3/1965 | Gurnee et al. | |
| 3,173,050 A | 3/1965 | Gurnee et al. | |
| 3,710,167 A | 1/1973 | Dresner et al. | |
| 4,356,429 A | 10/1982 | Tang | |
| 4,539,507 A | 9/1985 | VanSlyke et al. | |
| 4,720,432 A | 1/1988 | VanSlyke et al. | |
| 4,885,211 A | 12/1989 | Tang et al. | |
| 4,950,950 A | 8/1990 | Perry et al. | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,569 A | 10/1991 | VanSlyke et al. | |
| 5,073,446 A | 12/1991 | Scozzafava et al. | |
| 5,141,671 A | 8/1992 | Bryan et al. | |
| 5,150,006 A | 9/1992 | Van Slyke et al. | |
| 5,151,629 A | 9/1992 | VanSlyke | |
| 5,776,622 A | 7/1998 | Hung et al. | |
| 6,127,004 A | 10/2000 | Hatwar et al. | |
| 6,208,077 B1 | 3/2001 | Hung | |
| 6,696,177 B1 * | 2/2004 | Hatwar ................ | 428/690 |
| 2003/0137242 A1 * | 7/2003 | Seki .................... | 313/506 |
| 2004/0031962 A1 * | 2/2004 | Hasegawa et al. ......... | 257/58 |

(Continued)

OTHER PUBLICATIONS

"Enhanced performance of polymer light-emitting diodes using high-surface area polyaniline network electrodes" by Y. Yang, E. Westerweele, C. Zhang, P. Smith, and A.J. Heeger, Journal of Applied Physics, vol. 77, 694 (1995).

(Continued)

*Primary Examiner*—Trung Dang
(74) *Attorney, Agent, or Firm*—Raymond L. Owens (57) ABSTRACT

A method of making an electronic device in which a conductive electrode has been formed over a substrate including using a liquid to clean the conductive electrode, heating in a processing station the conductive electrode to a temperature which dries the conductive electrode and thereby removes residual cleaning liquid applied during the cleaning step, and providing an oxidizing plasma in the processing station to modify the properties of the conductive electrode. The method also includes producing a fluorocarbon plasma in the processing station to form a fluorocarbon layer over the modified conductive electrode, and further processing the structure to produce the electronic device.

8 Claims, 3 Drawing Sheets

U.S. PATENT DOCUMENTS

2004/0201048 A1*  10/2004  Seki et al. ................. 257/294
2005/0048786 A1*  3/2005  Jo ............................. 438/706

OTHER PUBLICATIONS

"Organic electroluminescent devices with improved stability" by S.A. Van Slyke, C.H. Chen, and C.W. Tang, Applied Physics Letters, vol. 69, 2160 (1996).

"Surface modification of indium tin oxide by plasma treatment: An effective method to improve the efficiency, brightness, and reliability of organic light emitting devices" by C.C. Wu, C.I. Wu, J.C. Sturm, and A. Kahn, Applied Physics Letters, vol. 70, 1348 (1997).

\* cited by examiner

PROVIDING FLUOROCARBON LAYERS ON CONDUCTIVE ELECTRODES IN MAKING ELECTRONIC DEVICES SUCH AS OLED DEVICES

FIELD OF THE INVENTION

This invention relates generally to the manufacture of display devices and, more particularly, to forming a fluorocarbon layer on a conductive electrode of an electronic device such as an OLED device.

BACKGROUND OF THE INVENTION

Organic EL devices are known to be highly efficient and are capable of producing a wide range of colors. Useful applications such as flat-panel displays have been contemplated. Representative of earlier organic EL devices are Gurnee et al. U.S. Pat. No. 3,172,862, Gurnee U.S. Pat. No. 3,173,050, and Dresner U.S. Pat. No. 3,710,167. Typical organic emitting materials were formed of a conjugated organic host material and a conjugated organic activating agent having condensed benzene rings. The organic emitting material was present as a single layer medium having a thickness significantly greater than 1 micrometer. Thus, this organic EL medium was highly resistive and the EL device required an extremely high voltage (>100 volts) to operate.

The most recent discoveries in the art of organic EL device construction have resulted in devices having the organic EL medium including extremely thin layers separating the anode and cathode. The thin organic EL medium offers reduced resistance, permitting higher current densities for a given level of electrical bias voltage. In a basic two-layer EL device structure, one organic layer is specifically chosen to inject and transport holes, and the other organic layer is specifically chosen to inject and transport electrons. The interface between the two-layers provides an efficient site for the recombination of the injected hole-electron pair and resultant electroluminescence. Examples are provided by U.S. Pat. Nos. 4,356,429; 4,539,507; 4,720,432; 4,885,211; 4,950,950; 5,047,687; 5,059,861; 5,061,569; 5,073,446; 5,141,671; 5,150,006; and 5,151,629.

The simple structure can be modified to a three-layer structure, in which an additional electroluminescent layer is introduced between the hole and electron transporting layers to function primarily as the site for hole-electron recombination and thus electroluminescence. In this respect, the functions of the individual organic layers are distinct, and can therefore be optimized independently. Thus, the electroluminescent or recombination layer can be chosen to have a desirable EL color as well as a high luminance efficiency. Likewise, the electron and hole transport layers can be optimized primarily for the carrier transport property.

The organic EL devices can be viewed as a diode which is forward biased when the anode is at a higher potential than the cathode. The anode and cathode of the organic EL device can each take any convenient conventional form, such as any of the various forms disclosed by Tang et al. in U.S. Pat. No. 4,885,211. Operating voltage can be substantially reduced when using a low-work function cathode and a high-work function anode. The preferred cathodes are those including a metal having a work function less than 4. V and one other metal, preferably a metal having a work function greater than 4.0 eV. The Mg:Ag of Tang et al. U.S. Pat. No. 4,885,211 constitutes one preferred cathode construction. The Al:Mg cathodes of Van Slyke et al. U.S. Pat. No. 5,059,862 are another preferred cathode construction. The use of a LiF/Al bilayer to enhance electron injection in organic EL devices has been disclosed by Hung et al. in U.S. Pat. No. 5,776,622.

Conventional anodes are formed of a conductive and transparent oxide. Indium tin oxide has been widely used as the anode contact because of its transparency, good conductivity, and high work function. However, a device grown on a bare ITO surface generally shows insufficient hole injection and poor operational stability. The mitigation of these problems has involved introducing an intermediate layer between the ITO and the organic medium. Yang et al. reported a polymer EL device with improved charge carrier injection by using a polyaniline layer between the ITO and active electroluminescent layer in "Enhanced performance of polymer light-emitting diodes using high-surface area polyaniline network electrodes" by Y. Yang, E. Westerweele, C. Zhang, P. Smith, and A. J. Heeger, Journal of Applied Physics, Vol. 77, 694 (1995). Van Slyke et al. demonstrated a highly stable organic device formed by using a CuPc layer between the ITO and the hole-transporting layer in "Organic electroluminescent devices with improved stability" by S. A. Van Slyke, C. H. Chen, and C. W. Tang, Applied Physics Letters, Vol. 69, 2160 (1996). It has also been found that the indium-tin-oxide (ITO) anode contact to an organic EL device can be significantly improved via oxygen plasma treatment without introducing a CuPc layer. The resulting device can be operated at low voltages, and exhibits good stability. The observation is consistent with the findings by Wu et al. in polymer light-emitting diodes, "Surface modification of indium tin oxide by plasma treatment: An effective method to improve the efficiency, brightness, and reliability of organic light-emitting devices" by C. C. Wu, C. I. Wu, J. C. Sturm, and A. Kahn, Applied Physics Letters, Vol. 70, 1348 (1997). Furthermore, it was discovered by Hatwar et al. in U.S. Pat. No. 6,127,004 that operational stability and hole injection could be further improved by providing an amorphous fluorocarbon layer over the plasma treated anode.

As disclosed by Hatwar et al. in U.S. Pat. No. 6,127,004, ITO-coated glass is cleaned in an aqueous ultrasonic bath with detergent, followed by rinsing in deionized water, followed by degreasing in organic solvents, followed by oxygen plasma treatment. More complex substrates patterned with photoresist are subjected to aqueous acid etch processes of underlying layers and organic solvent stripping of the photoresist. These substrates are then cleaned in an aqueous ultrasonic bath with detergent, followed by rinsing in deionized water, followed by an oven bake in air at temperatures up to 200° C. for times up to 1 hour. The final bake hardens integral organic layers such as photoresist and organic planarization layers and drives out residual moisture from the various aqueous processing steps. It is desirable to minimize the time between this bake-out step and further processing to avoid recontamination of the cleaned ITO-coated glass. Thereafter, in separate chambers, the substrate can be exposed to a two-step plasma treatment, the first step being an oxygen plasma or other oxidizing agent in order to clean and oxidize the anode surface, and the second being a fluorocarbon plasma deposition. The presence of a fluorocarbon film can be detrimental in areas outside the active display area of an OLED flat-panel display, particularly if adhesion of an encapsulating structure to the substrate is necessary. Therefore, it is necessary to remove fluorocarbon deposits by further plasma processing after the cathode layer is formed (device area masked off, either by the cathode layer itself or an additional mask), or to use contact shadow masking techniques to minimize fluorocarbon deposits around the periphery of devices (borders masked off) during deposition of the fluorocarbon film.

SUMMARY OF THE INVENTION

It is an object of the present invention to provide an improved and more effective way of forming a fluorocarbon layer on a conductive electrode.

It is a further object of the present invention to provide an improved and more effective way of forming a fluorocarbon layer by using the same chamber in the surface processing of the ITO electrode and the forming of the fluorocarbon layer.

These objects are achieved by a method of making an electronic device in which a conductive electrode has been formed over a substrate, comprising:

a) using a liquid to clean the conductive electrode;

b) heating in a processing station the conductive electrode to a temperature which dries the conductive electrode and thereby removes residual cleaning liquid applied during the cleaning step;

c) providing an oxidizing plasma in the processing station to modify the properties of the conductive electrode;

d) producing a fluorocarbon plasma in the processing station to form a fluorocarbon layer over the modified conductive electrode; and e) further processing the structure to produce the electronic device.

ADVANTAGES

It is a feature of the present invention that the use of shadow masks in the formation of a fluorocarbon on the ITO electrodes can be limited, which minimizes the number of processing stages.

It is another feature of the present invention that the substrate structure can be processed within the same chamber to produce steps c) and d) above.

Another feature of the present invention is the ability to deposit the fluorocarbon layer selectively onto ITO.

It is an advantage of the present invention that the process is compatible with oven baking of substrates prior to coating devices, because oven enclosure could be designed with an integral electrode system for carrying out the atmospheric pressure discharge processes for oxygen plasma treatment and fluorocarbon deposition onto the patterned ITO electrodes.

It is an advantage of the present invention that all steps of the process can be performed at pressures of 0.1 Bar or higher, thus limiting the need for the expensive pumping systems that are normally required for plasma processes.

DETAILED DESCRIPTION OF THE INVENTION

Carrier gases useable with this invention are preferably inert gases such as helium or argon or mixtures thereof. In the case of oxygen treatment of the ITO, the active gases can be oxygen, nitrous oxide, or other suitable oxidants. In the case of fluorocarbon treatments, the active gases can be volatile fluorocarbon compounds, such as $CHF_3$, $CF_4$, $C_4F_8$, other fluorocarbons or fluorohydrocarbons, and mixtures thereof.

The oxygen treatment and fluorocarbon treatment processes can be carried out in serial fashion, or oxidant can be added to the fluorocarbon/carrier gas mixture in a single treatment step. In either case, the processed ITO-coated substrates are passivated and are ready for coating device structures thereon.

By using atmospheric (or near atmospheric) pressure discharges, the surface treatment processes can be readily integrated with the final baking process prior to coating devices. Furthermore, spatially selective deposition of the fluorocarbon layer without the use of shadow masks can be carried out by suitable choice of electrode geometry (to limit the treatment area) and by suitable choice of active/carrier gas composition (to achieve selective deposition of fluorocarbon polymer onto ITO).

Figure 1:
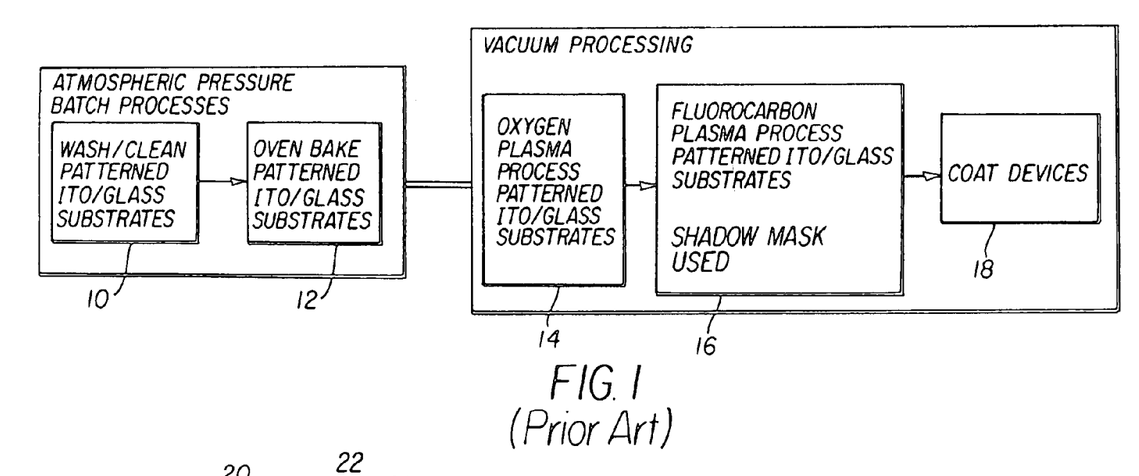
FIG. 1 shows, in schematic form, the conventional substrate preparation and plasma processing steps.

Turning now to FIG. 1, a schematic of the process steps of prior art is shown. The term "substrate" refers to the support underneath the electrode(s). Patterned ITO electrodes on a glass substrate are washed in liquids 10 to clean the surface of the conducting electrode that has been formed over an underlying substrate. After cleaning, the substrate with conducting electrodes is baked in an oven 12 in ambient air. The substrates can be cleaned and baked individually or in cassettes holding several substrates. The substrates are then placed into a load lock and fed into a vacuum system, such as a cluster tool, where they are processed individually. Each substrate is moved into a chamber wherein an oxygen plasma process 14 is established and the substrate is exposed thereto. Subsequently, each substrate is moved into a second chamber and aligned with a shadow mask. Flurocarbon deposition 16 is carried out by establishing a plasma containing fluorocarbon gases (e.g., a mixture of argon and $CHF_3$), and exposing the masked substrate thereto. Finally, the oxygen-treated, fluorocarbon-coated ITO/glass substrates are moved into other coating chambers (either within the same cluster tool or they are brought to atmosphere via load lock and then placed in a separate machine) where OLED device layers are coated 18. Prior to completion of the device packaging, residual fluorocarbon material must be cleaned away by post-deposition oxygen plasma etching to prepare the perimeter of the devices for sealing and encapsulation.

Figure 2:
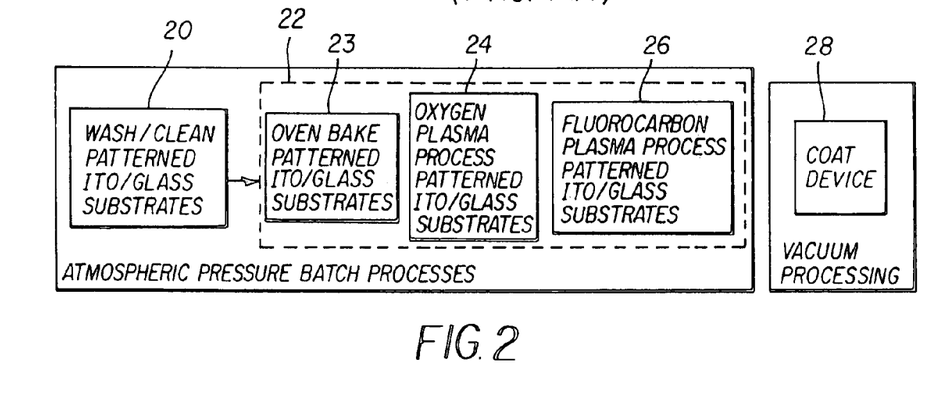
FIG. 2 is a schematic of substrate preparation and plasma processing steps in accordance with the present invention.

Another embodiment of this process is illustrated in FIG. 2, where atmospheric pressure processing of an electrode and a substrate is shown schematically.

The substrate can be prepared from any material that is suitable for carrying one or more conducting electrodes.

Materials used for substrates are generally nonconducting, but can include materials having some ionic conductivity. Examples of some materials useful for substrates include electrically insulating nonconducting organic polymers such as "Kapton"™ polymer (available from E.I. du Pont De Nemours and Company, Wilmington, Del.), random fiber materials such as resin impregnated aramic polymer fiber papers under the trade name of "Nomex" (available from E.I. du Pont De Nemours and Company, Wilmington, Del.), epoxy impregnated fiber papers including those papers containing polyester, Dacron, or glass fibers, Teflon based materials containing fluoroethylene polymers (FEP Teflon), and polyvinyl chloride polymer substrates. Other suitable ceramic substrate materials include electrically insulating glasses of all types, glass ceramics, porcelains, and dense single phase or mixed-oxide phase materials. Examples of electrically insulating nonconducting ceramic substrate materials include porcelain, zircon, steatite, forsterite, coerdierite, alumina, spinel, mullite, magnesia, beryllium oxide, zirconia, thoria, haffia, ceria, spudomene, aluminum nitride, titanium oxides lithium-alumina-silicates, boron nitride, silicon oxides, silicon nitrides, silicon oxynitrides, pyroceram, glass bonded mica, lead-alumina silicate, fused quartz, borosilicate glasses, phosphate containing glasses, germanate containing glasses, and alkali metal containing borosilicate glasses. Substrate materials for electrodes are described in more detail in "Ceramic Materials for Electronics—Processing, Properties, and Applications" edited by R. C. Buchanan, Marcel Decker Inc, 1986, NY, N.Y. and "Flexible Circuits—Design and Application" by Steve Gurley, Marcel Decker, Inc, 1984, NY, N.Y. Another type of substrate material includes conducting or semiconducting materials having a surface layer with electrically insulating properties. An example of a substrate having a semiconducting material with an electrically insulating surface layer is semiconducting silicon with an electrically nonconducting surface layer of silicon dioxide.

The substrate can be fabricated to any desired shape, size, density, and thickness depending on the desired application. Generally substrates are fabricated in the form of flat plates, discs, wafers, or ribbons. Flexible substrates can be used, and flexible substrates are generally thinner than rigid substrates to impart the desired mechanical properties to the substrate.

Electrodes made from electrically conducting material are located on at least one surface of the underlying substrate.

Electrically conducting materials useful for electrodes include metallic and semiconducting materials with electrical resistivity varying from greater than 0 ohm-cm to less than $10^7$ ohm-cm, depending on the desired application. Examples of elemental metallic materials used as electrodes include gold, silver, copper, aluminum, tantalum, platinum, and carbon in various forms including graphite and niobium. Many solid elements in the Periodic Table in groups 1a, 2a, 3b, 4b, 5b, 6b, 8, 1b, 2b, 3a, 4a, 5a, and 6a can be use electrodes. The Periodic Table referred to here is that given in the Handbook of Chemistry and Physics $65^{th}$ edition, published by CRC press, Boca Raton, Fla.

Elements that can be made electrically conducting by the introduction of impurities into the crystal lattice can be used as electrodes. This process is known as doping and is frequently done for the preparation of semiconducting materials in the microelectronics industry. The advantage to this approach is that the electrical conductivity of the electrode can be controlled and specified for the particular application. An example of an electrode material prepared by introduction of impurities into the crystal lattice is semiconducting silicon where boron, phosphorus, or arsenic has been added in small amounts to the silicon to improve the electrical properties of the material. Silicon can be doped to prepare both n-type and p-type semiconductors with varying electrical properties.

Electrically conducting solid chemical compounds prepared from two or more elements can also be used as electrodes. For example, compounds prepared from groups 2b and 6a (the so-called II–IV semiconductors) are electrically conducting when properly prepared by one skilled in the art. Zinc oxide (ZnO) and cadmium sulfide (CdS) are two examples of electrically conducting materials prepared from group 2b and 6a elements. Another class of electrically conducting compounds is materials prepared from groups 3a and 5a. Gallium arsenide (GaAs) and indium antimonide (InSb) are examples of electrically conducting materials prepared from group 3a and 5a elements. Complex chemical compounds containing elements selected from group 6a are of interest and cover a broad class of compounds that are electrically conducting known as oxides and chalcogenides. Many electrically conducting oxides are known and their electrical properties range from super conducting to high resistivity semiconductors. A description of highly conducting oxide ceramics for electronics is given by H. L Tuller in "Ceramic Materials for Electronics—Processing, Properties, and Applications" (R. C. Buchanan, Ed., Marcel Dekker, Inc, NY, N.Y., 1986, pp 425–473).

Oxide materials of particular interest contain elements selected from groups 1b, 2b, 3a, 4a, and 5a. Oxide materials with electrical resistivity between 0 ohm-cm and $10^6$ ohm-cm, and an optical transmission spectrum greater than 50% in at least wavelength of the wavelength between 300 nm and 700 nm, are called transparent conducting oxides. An example of an electrically conducting oxide prepared from elements in groups 3a and 4a is indium tin oxide (ITO) where the ratio of moles of tin to moles of indium ranges from 0.00001 to 0.2. Unlike many other electrically conducting materials, ITO can be prepared as a thin film with low electrical resistivity that shows at least one region of optical transmission which has a transmittance greater than 50% T in the wavelength region from about 300 nm to 700 nm. An example of another useful transparent conducting oxide prepared from elements in group 1b is the compound $CuAlO_2$ that crystallizes with the delafossite structure type. Other examples of useful transparent conducting oxides are $Cd_2SnO_4$, $CdO$, $Zn_2SnO_4$, and $Cu_2SrO_2$. Many useful transparent conducting oxides contain the element indium. Useful transparent conducting oxides are discussed by J. L Vossen in "Physics of Transparent Conducting Films", Thin Films, 9,1 (1977) and by K. L. Chopra, S. Major, and D. K. Pandya in "Transparent Conductors—A Status Review", Thin Solid Films, 102, 1 (1983).

Another class of materials useful for electrodes are composite materials that are prepared by successive deposition of layers of different conducting materials. Materials of this type are described by Robbins and Wolden in "High mobility oxides: Engineered structures to overcome intrinsic performance limitations of transparent conducting oxides", Applied Physics Letters (2003), 83(19), 3933–3935.

Electrically conducting materials useful for electrodes can also be prepared from mixtures of materials where at least one component is electrically conducting. For example, dispersions of colloidal metal particles in a polymeric binder can be applied to a substrate, then dried to form an electrode. A well known electrically conducting dispersion can be prepared from graphite and water. An example of an electrically conducting aqueous graphite dispersion that can be used as an electrode is "Aquadag"™ (Acheson Colloids Company, 1600 Washington Avenue, Port, Huron, Mich.). An example of an electrically conducting nonaqueous graphite dispersion with a polymeric binder is "Electrodag 109" (Acheson Colloids Company, 1600 Washington Avenue, Port, Huron, Mich.).

Electrodes can have any size, shape, density, and thickness suitable for the desired application. For example, large monolithic electrodes can be used for certain processes, while thin film electrodes can be required for other applications. An example of a large monolithic electrode is a block of graphite. An example of a small flexible electrode is a silicon nanowire. Another example of a microelectrode is a single wall carbon nanotube.

Electrodes are formed over a substrate by any variety of ways known in the art including ink jet deposition of appropriate layers, as well as deposition of appropriate layers by air brush methods or hand painting, syringe based dispensing methods, electrostatic spraying methods, ultrasonic spray methods, electrochemical deposition methods, silk screen printing, solvent coating, blade and curtain coating methods, gravure coating methods, spin coating methods, electrophoretic deposition methods, deposition from supercritical fluids at elevated pressures, atmospheric pressure chemical vapor deposition methods, plasma assisted atmospheric pressure chemical vapor deposition methods, physical vapor deposition at atmospheric pressure, as well as low pressure deposition methods operating below a pressure of 0.1 bar including resistive evaporation, low pressure plasma assisted chemical vapor deposition, reduced pressure chemical vapor deposition, ion assisted resistive evaporation, and sputtering. All these technologies have applications in the preparation electrodes for electronic device formation.

Patterned ITO/glass substrates are washed in liquids 20. The washing step removes particles, inorganic and organic contaminants, as well as other impurities from the substrate surface. This is important because contamination on the surface of the electrode or substrate can lead to the formation of device defects that result in undesirable device performance or even device failure. For example, a contaminant on an electrode can result in poor adhesion of applied coatings that can lead to device failure.

Washing or cleaning of the substrate in a liquid can be done manually or by an automated process using a machine. A large number of washing methods are available for cleaning substrates in liquids including ultrasonic cleaning in a liquid, solvent cleaning in a liquid, electrolytic cleaning and electro-polishing in a liquid, aqua blasting, acid and alkaline cleaning, cryogenic cleaning or washing using supercritical fluids, oxidative or reductive chemical cleaning in solution, and physical-chemical cleaning processes including brushing methods done while the substrate is immersed in a liquid solution.

The substrate can be exposed to one or more different liquids during the liquid washing step where the substrate is cleaned. The liquid can be an aqueous solution with a specified pH, an organic solution like 1,1,2-trichloroethylene, methylene chloride, isopropanol, or petroleum distillates, or a supercritical fluid like supercritical carbon dioxide. Aqueous based liquids for washing contain many different components including pH buffers, anionic or cationic surfactants, solvents such as glycol ethers or alcohols, dispersing agents, corrosion inhibitors, chelating or sequestering agents for removal of metal cations, and defoaming agents. Aqueous cleaning solutions can be acidic, basic, or neutral, depending on the type of contaminant to be removed. An example of a commonly used liquid solution for washing electrodes and substrates is an aqueous solution of "Alconox"™ anionic powdered detergent (Alconox, Inc, 30 Glenn Street, White Plains, N.Y.). Organic solutions are also called solvents and are most effective in dissolving and removing organic materials, such as oils and grease, or other contaminants that are soluble in the given liquid. Solvent cleaning liquids can include 1,1,2-trichloroethylene, petroleum distillates, aliphatic hydrocarbons, alcohols, methylene chloride, n-propyl bromide (nPB), hydrofluoroethers (HFEs), volatile methyl solixanes (VMS), hydrofluorocarbons (HFCs), and perfluorocarbons (PFCs).

A liquid cosolvent cleaning system also can be used during the washing step to clean the electrode and substrate. Cosolvent cleaning systems are designed to use two liquids: a solvating agent; and a rinsing agent. The properties of the cleaning and rinsing agent can be matched to the contaminants of concern. This permits for optimization of each step in the cleaning process. Cosolvent systems are especially useful in applications where substrates have complex internal geometries that can be difficult to reach and other precision applications, such as electronics and optics. Any of the commonly accepted classes of cosolvent cleaning systems can be candidates as liquids for the washing step. Based upon the properties of solvating and rinse agents, cosolvent systems are divided into five main categories: Class I; Class IIA; Class IIB; Class III; and Class IV. Class I cosolvent systems, or semi-aqueous cleaning systems, feature a solvent-based wash component and an aqueous-based rinse. Typical solvents include alcohols and terpenes which commonly have surfactants added to them to enhance cleaning and rinsability. Class II cosolvent systems include washing and rinsing agents that are insoluble in one another. Class IIA cosolvent systems utilize immiscible wash and rinse solvents. Cleaning is performed by the denser wash layer, where solvents used are generally low-volatility, higher-flash point hydrocarbons, such as terpenes or esters. Rinsing can be performed by an insoluble, inert perfluorocarbon that floats on top. Class IIB cosolvent systems utilize higher volatility, low-flash point solvents such as isopropyl alcohol, methanol, or cyclohexane. Again, rinsing can be performed using perfluorocarbons. The flammabilty of the wash agent is suppressed upon mixing with an inert rinse agent. Class III cosolvent systems utilize two solvents that are miscible (soluble) in each other. Rinsing occurs by dilution of the wash solvent with a medium flash point (combustible) liquid. Surface cleanliness is governed by the remaining concentration of the wash solvent in the rinse. Distillation is often used to purify rinse water prior to reuse. Class IV cosolvent systems are formed when two miscible solvents form an azeotrope. An azeotrope is a mixture that maintains a constant percentage of each component, even upon distillation. Thus, azeotropic solvents can act as both the wash and rinse agent. Cosolvent machines are designed to provide optimized washing/rinsing of the substrate.

Chemical cleaning of electrodes and substrates can also be accomplished by the use of acidic or basic solutions. Aqueous liquids with pH less than 7 can include common acid materials include mineral acids (hydrochloric, sulfuric, nitric.) Chromic acid can be used to prepare a typical acidic solution (pH of 4), while hydrochloric acid can generate a solution with a pH of less than 2.

Cleaning liquids for washing that range in pH from 6 through 8 are considered neutral. Neutral cleaning solutions generally include surfactants, which function as wetting and emulsifying agents. Other ingredients, such as corrosion inhibitors and dispersants, are generally added as well.

These formulations are best suited for removing organic residues (e.g., oil and grease) and many inorganic residues.

Alkaline liquid solutions can be formulated by adding such materials as sodium or potassium hydroxide, carbonate, bicarbonate, phosphate, silicate, or other similar materials. A solution at a pH of 13.5 will remove carbonaceous soils. pHs from 8 to 13 are generally used to remove oils and greases. Alkaline cleaning solutions employ both physical and chemical means to clean the substrate surface. Chemical action can occur via saponification of certain contaminants. In the saponification process, water-soluble soaps are produced by the neutralization of fatty acid soils. Physical cleaning occurs via wetting and emulsification provided by the addition of surfactants.

Examples of oxidative cleaning liquids are those commonly found in semiconductor processing. Mixtures of sulfuric acid with hydrogen peroxide in deionized water heated to between 100° C. and 130° C. are commonly used as liquids to remove organic contamination from electrodes and substrates. Another liquid used for reducing metal contamination employs hydrofluoric acid or dilute hydrofluoric acid at room temperature. Another example of a liquid used to remove organic contamination as well as particles from a surface is a mixture of ammonium hydroxide, hydrogen peroxide, and deionized water heated to between 60° C. and 80° C. Another liquid used for cleaning substrates and electrodes by removing metallix contaminant is a mixture of hydrochloric acid, hydrogen peroxide, and deionized water held at between 60° C. and 80° C. Ultra-pure water is a liquid that is also used to remove any residual contamination on the substrate and electrode(s) from previous cleaning steps.

The clean electrode(s) and substrate are then loaded into an atmospheric pressure processing station 22 having a chamber. The term "atmospheric pressure" is used herein to refer to a pressure regime where the pressure is greater than 0.1 Bar. In this regime, gaseous species collide with one another far more frequently than they do with the walls of the chamber, and inexpensive techniques can be used to establish the process gas environment (i.e., composition and pressure of the working gas). In this processing station 22, the substrates (e.g., ITO electrodes on glass) are baked in an oven 23 by heating to a temperature, which dries the ITO electrodes and substrate and thereby removes residual liquid applied during cleaning of the ITO electrodes and substrate. Heating of the substrate and electrode can be accomplished by any appropriate method known to those skilled the art. For example, heating methods can include radiant heating of the substrate. Another method for heating the substrate and electrode(s) can be exposing to the substrate and electrode(s) to a heated gas that is either passively circulated in the processing station by convection or mechanically circulated in the processing station by use of a fan. The duration of the heating and baking of the substrate and electrode(s) is sufficient to ensure that the substrates are dry and that residual liquid applied during the cleaning step of the electrodes and substrate is removed.

Purging the chamber of the atmospheric pressure processing station can be done whenever a new process gas is used in the chamber when it is necessary to control the concentration of impurities in the chamber. After baking, the chamber is purged by flowing a gas through the chamber to remove undesirable gaseous species that can be in the chamber. Purging the chamber is accomplished by any appropriate method known to those skilled in the art. For example, a purified gas such as nitrogen or oxygen, or a desired gas mixture such as oxygen mixed with helium, can be flowed through the chamber for a suitable amount of time to reduce the concentration of undesirable gaseous species below a certain level. Another method of purging the chamber is to reduce the pressure in the chamber using a vacuum pump, aspirator, dry pump, scroll pump, or other ways to achieve reduced pressure within the chamber, then backfill the chamber with a purified gas or gas mixture. Additional cycles of reduced pressure followed by backfilling with the desired gas or gas mixture can further reduce the concentration of undesirable gaseous species in the chamber.

After baking and purging the chamber, the same equipment in the atmospheric pressure processing station 22 is used to establish oxygen-bearing and fluorocarbon-bearing plasmas near atmospheric pressure. An oxygen-bearing plasma can be achieved by use of an oxygen-bearing gas in the atmospheric pressure processing station. An oxygen-bearing gas is any gas or gas mixture that contains oxygen. Examples of oxygen-bearing gases are molecular oxygen ($O_2$), water ($H_2O$), nitrous oxide ($N_2O$), nitric oxide (NO), a mixture of helium gas (He) and oxygen gas ($O_2$) in any proportion, or a mixture of argon gas (Ar) and water ($H_2O$) in any proportion. A fluorocarbon-bearing gas is any gas or gas mixture that contains carbon and fluorine. Examples of fluorocarbon-bearing gases are trifluoromethane ($HCF_3$), tetrafluoroethylene ($C_2F_4$), octafluorocyclobutane ($C_4F_8$), a mixture of helium gas (He) and trifluoromethane ($HCF_3$) in any proportion, or a mixture of argon gas (Ar) and octafluorocyclobutane ($C_4F_8$) in any proportion.

The oxygen plasma processing 24 and the fluorocarbon deposition 26 can be carried out as separate steps including purging the chamber in between process steps in the same chamber or in a single step with a gas mixture containing both oxidant and fluorocarbon. The oxidizing plasma in the atmospheric pressure processing station 22 modifies the properties of the ITO electrodes by, for example, cleaning them (combustion of residual material from the cleaning process) and altering the work function and other electrical properties of the ITO by affecting the oxygen content of the ITO. The fluorocarbon deposition plasma in the atmospheric pressure processing station 22 produces condensable fluorocarbon species that deposits to form a layer on the surface of the ITO (for example, the condensable species polymerize on the ITO surface or otherwise react to form nonvolatile species thereon). The substrates (substrates and ITO electrodes) thus prepared are removed from the processing station (chamber) for further processing 28 (i.e. vacuum coating steps or other methods suitable for deposition of a light-emitting structure) to form OLED devices. Many methods exist for deposition of materials for formation of OLED devices. Of particular interest with respect to the present invention are methods for forming light-emitting structures that operate at or near atmospheric pressure. Such methods include (but are not restricted to) ink jet deposition of appropriate layers as well as deposition of appropriate layers by air brush methods or hand painting, syringe based dispensing methods, electrostatic spraying methods, electrochemical deposition methods, silk screen printing, solvent coating, blade and curtain coating methods, gravure coating methods, spin coating methods, electrophoretic deposition methods, deposition from supercritical fluids at elevated pressures, atmospheric pressure chemical vapor deposition methods, plasma assisted atmospheric pressure chemical vapor deposition methods, and physical vapor deposition at atmospheric pressure. All these technologies have application in the preparation of both molecular as well as polymer-based layers for electronic device formation. Additional features of the atmospheric pressure processing, such as maskless patterning of the fluorocarbon layer by processes where the fluorocarbon layer is selectively deposited on the conductive electrode on a substrate or on a conductive electrode structure formed on a substrate (either by suitably shaped electrodes or by suitable choice of process gas so as to effect selective deposition onto an electrode or transparent conducting oxide like ITO), simplify the post-deposition etch processes to remove fluorocarbon residue from areas where its presence is undesirable that are required to prepare the perimeter of the devices for sealing and encapsulation. Post-deposition etch processes are well known in the art, and for fluorocarbon layers use plasmas containing oxygen or plasmas containing argon and hydrogen, either alone or in sequence, or they use some combination of gases in the plasma such that fluorine is removed (e.g. in the form of HF) from the fluorocarbon and the remaining carbon-bearing material is oxidized to produce volatile species such as CO and $CO_2$. Furthermore, with the fluorocarbon layer applied prior to removal from the processing station 22, the delay between substrate preparation and device coating is less of a concern. Hence, batches of substrates can be prepared in advance of device coating operations without the need to synchronize the schedules for substrate preparation and device coating operations.

Figure 3:
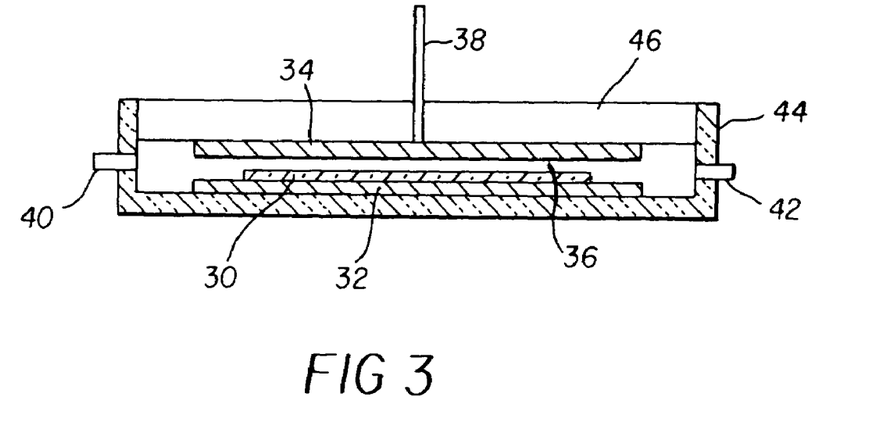
FIG. 3 is a cross sectional view of a process chamber used in accordance with the present invention.

FIG. 3 shows a cross sectional view of an atmospheric pressure processing station for a single substrate 30 in accordance with the present invention. The ITO/glass substrate 30 is loaded onto a platen electrode 32. The platen electrode 32 and the upper electrode 34 form a spaced electrode pair providing a gap 36 in which a dielectric barrier discharge (DBD) or atmospheric pressure glow discharge (APGD) is be established by application of a time-varying high voltage (power supply not shown) via a power feed 38. The upper electrode 34 and the platen electrode 32 can be metallic or metal covered with a dielectric material (e.g., quartz, alumina, etc.), depending on the nature of the top surface of the platen electrode 32, and depending on the way in which the discharge is established. For reference on DBD and APGD, see Massines et al., "Physics and chemistry in a glow dielectric barrier discharge at atmospheric pressure: diagnostics and modeling,"; Massines, F., Segur, P., Gherardi, N., Khamphan, C., Ricard, A,. *Surface and Coatings Technology*, 174–175, pp.8–14 (2003). For reference on APGD with no dielectric, see Selwyn et al., "The atmospheric pressure plasma jet (APPJ): science and applications", Selwyn, G. S., Park, J., Herrmann, H., Snyder, H., Henins, I., Hicks, R. F., Babayan, S. E., Jeong, J. Y., Tu, V. J., Advances in Applied Plasma Science, 2, pp. 111–118 (1999). Process gases are introduced through an inlet 40 and exhausted through an outlet 42. The exhausted gases can be recovered, purified, and reused (in particular helium) as required. The electrode assembly is housed in a thermally insulating container 44. The upper electrode 34 can be affixed to a container top 46 with appropriate electrical isolation (e.g., by use of insulating material between the electrode and the top, or by making the top of the container from insulating material). The container 44 and its top 46 are heated (heating system not shown) for substrate baking. After baking, the container and top are cooled down to room temperature and process gases are introduced, or an appropriate temperature is established for running the desired processes. Power is supplied to the power feed 38 to produce the discharge and perform the oxygen treatment or CFx deposition or combination thereof.

Figure 4:
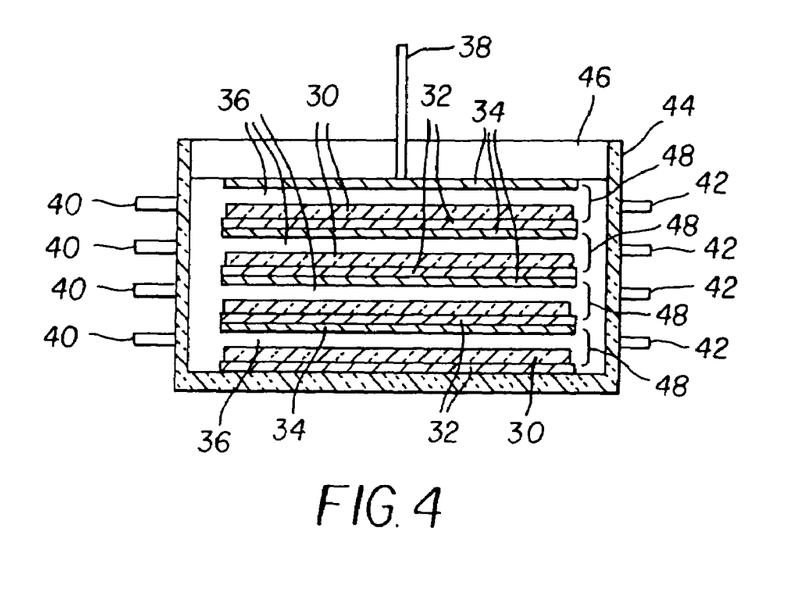
FIG. 4 is a cross sectional view of another process chamber for processing multiple substrates in stacked fashion using a series of electrode pairs in accordance with the present invention.

Another atmospheric pressure processing station for processing multiple substrates 30 is shown in FIG. 4, where several electrode pairs 48 are connected and driven in parallel. The substrates can be either individually loaded onto stationary electrodes, or a substrate cassette can be made such that the shelves holding the substrates serve as the electrode system. In either case, the top surface of the electrode is electrically isolated from its bottom surface, and the top surfaces are connected in parallel, as are the bottom surfaces. Thus, the bottom of the electrode serves as the upper electrode 34 for the substrate held on the next lower platen electrode 32.

Figure 5:
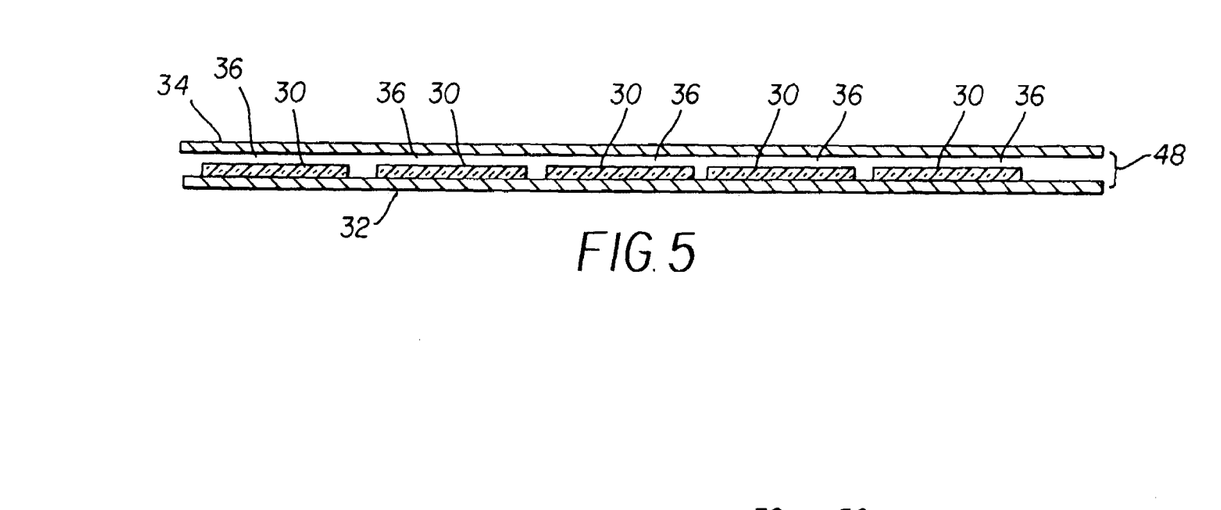
FIG. 5 is a cross sectional view of still another process chamber for processing multiple substrates in parallel using a single pair of electrodes in accordance with the present invention.

FIG. 5 illustrates another atmospheric pressure processing station to process multiple substrates, wherein the electrode area is increased relative to FIG. 4 in at least one dimension. Multiple substrates are placed on a large bottom platen electrode 32, with a large upper electrode 34 placed above to provide the electrode pair 48. The same considerations for electrical characteristics of the electrodes apply as for FIG. 4.

Figure 6:
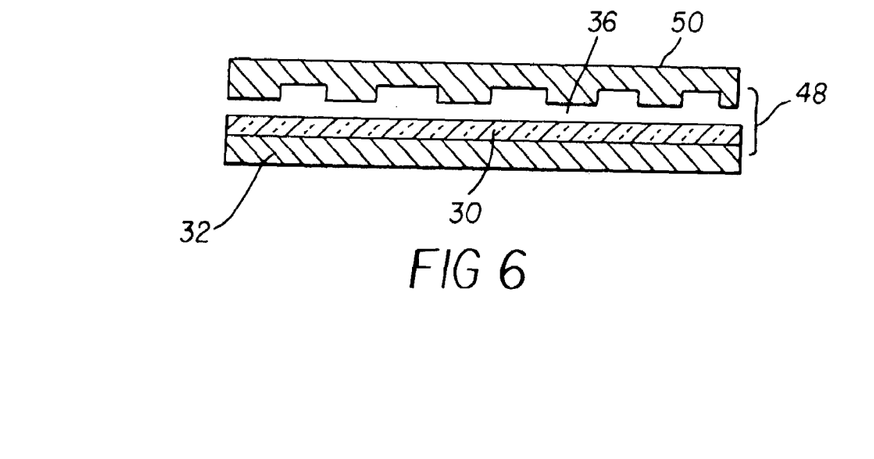
FIG. 6 is a cross sectional view of an electrode assembly wherein the gap between the electrodes is modulated by shaping the surface of at least one electrode in accordance with the present invention.

Shown in FIG. 6 is an electrode configuration for an atmospheric pressure processing station useful in generating patterned processing of substrates using shaped and appropriately positioned plasma producing electrodes to produce an oxygen-containing plasma in the atmospheric pressure processing station and using the shaped electrodes to produce a spatially modulated fluorocarbon plasma in the chamber, which forms a fluorocarbon layer in selected areas of the substrate electrode structure including over the substrate electrode structure. In FIG. 6 a plasma producing electrode in the atmospheric pressure processing station is shaped and appropriately positioned such that the gap between the plasma producing electrodes in the atmospheric pressure processing station (chamber) is spatially modulated by shaping the surface of at least one of the plasma producing electrodes. An upper electrode 50 has a modulated thickness. When placed above the substrate 30 and driven against the lower platen electrode 32, the discharge will occur preferentially where the electrode-substrate gap 36 is smallest.

There are two reasons for the localization of the discharge. First, Paschen's law in the high pressure-distance regime shows that the electrode regions where the gap is smaller will show gas ionization at lower voltages so the discharge will preferentially light in these areas and second, the applied electric field becomes localized at the regions in the patterned electrode showing sharp features thereby forcing the discharge to light preferentially in the areas where the features associated with the smallest gaps are located. The same result can also be obtained using a patterned lower electrode (not shown) with the substrate held onto the upper electrode.

The plasma producing electrodes are thus shaped to produce a spatially modulated fluorocarbon plasma in the chamber, which forms a fluorocarbon layer in selected areas of the substrate electrode structure including over the substrate electrode structure. The same shaped electrodes are used to produce a spatially modulated oxygen-containing plasma to modify the electrode surface and its work function prior to depositing the fluorocarbon layer. The areas of the electrode/substrate structure that are selectively processed can be entire devices or portions thereof, depending on the size of the device and its sub components and can include the modified electrodes. The electrode material can be a transparent conducting oxide such as indium tin oxide (ITO). When ITO electrode structures are formed on a substrate, the shaped and appropriately positioned plasma producing electrodes are used to produce an oxygen-containing plasma in the atmospheric pressure processing station (chamber) to modify the work function of the surface of the ITO electrode structure, and the shaped electrodes are also used to produce a spatially modulated fluorocarbon plasma in the chamber, which forms a fluorocarbon layer in selected areas of the substrate electrode structure including over the modified ITO electrodes.

EXAMPLES

A high purity silica plate 10 cm×10 cm was coated with indium tin oxide (ITO) having a sheet resistance of better than 20 Ohms/square. The coated area was a square 5.7 cm×5.7 cm. The corners were rounded by applying a mask of the desired shape, bead blasting away the ITO material outside the mask, and removing the mask. The ITO-coated glass electrode was positioned 6.4 mm above a large grounded aluminum plane 33 cm×33 cm, with the ITO-coated surface facing up (away from the aluminum plane). Contact was made to the conducting ITO surface using a spring loaded plunger with an indium-gallium eutectic alloy. The aluminum plane was covered by a thin Teflon sheet (1.6 mm thick). An area 7.6 cm×7.6 cm was cut out of the Teflon sheet directly beneath the ITO-coated glass electrode. Samples of glass with patterned ITO were then placed in the cut out region. The entire assembly (electrode, ground plane, Teflon sheet, sample, etc.) was housed in an enclosure into which process gas was admitted. A check valve on an exhaust port of the enclosure maintained the pressure at roughly 1.02 bar under steady state flow conditions. The geometry of the electrode assembly and enclosure were such that the actual flow between the ITO-coated electrode and samples was laminar, and was roughly 0.01 times the flow through the inlet to the enclosure. In order to avoid large nonuniformities associated with streamers typically formed in a dielectric barrier discharge, the conditions were chosen such that the discharge ran more as a glow than a streamer discharge.

The various factors associated with the streamer to glow transition are described by U. Kogelschatz in IEEE Transactions of Plasma Science, 30(4), 1400–1408, 2002. Atmospheric pressure glows can be observed using low frequencies with large electrode spacing. Alternatively, the streamers can be avoided by running a higher frequency discharge in helium such as taught by Selwyn. See, for example "The atmospheric pressure plasma jet (APPJ): science and applications" by Selwyn, G. S., Park, J., Hermann, H., Snyder, H., Henins, I., Hicks, R. F., Babayan, S. E., Jeong, J. Y., Tu, V. J., Advances in Applied Plasma Science (1999), 2 111–118. D. A. Glocker et al. describe near atmospheric pressure glow discharges based on helium and operating at 450 kHz (U.S. Pat. Nos. 5,558,843; 5,714, 308; 5,767,469; 5,789,145; 5,895,744; and 5,954,926). These 450 kHz near atmospheric pressure glow discharges were used for surface modification of polymer webs.

The atmospheric pressure discharges used here were operated between 300 kHz and 600 kHz, with normal operating conditions being between 400 kHz and 460 kHz. Power was applied by use of an ENI model 1140LA RF power amplifier, driven by a Wavetek Model 29 programmable signal generator. The output of the ENI power amplifier was fed to a custom built transformer that was impedance matched to the barrier discharge cell. The transformer was designed for a window of frequency operation of between 300 and 600 kHz. The dissipated power in the cell was calculated using the voltage and current waveforms taken from the high voltage side of the transformer. The voltage was monitored using a Tektronix model P6015A high voltage probe, and the current was monitored using a Pearson model 2100 inductive current transformer. The voltage and the current waveforms were read using a Tektronix model 544A digital oscilloscope, and the dissipated power was determined by taking the mean value of the power waveform (calculated by taking the product of the current and the voltage waveforms). The duration of the discharge was controlled manually. The gas flow into the cell was controlled using a Tylan RO-18 mass flow control console with appropriate flow controllers. The mass flow controller used for helium was calibrated for helium. All other mass flow controllers were calibrated with air or nitrogen and used without further correction for the gas being introduced.

Example 1

Glass substrates 7.6 cm×7.6 cm×1 mm thick were coated with 42 nm of indium tin oxide (ITO) and patterned to produce a set of ITO contacts (4 pairs). The sheet resistance of the ITO is roughly 50 Ohms/sq. The ITO/glass substrates were then cleaned in an ultrasonic bath in deionized water for roughly 10 minutes. The substrates were then spun dry under radiant heat. All samples in this example were vacuum plasma cleaned in a March Asher Model PX250 using flowing oxygen (40 SCCM) at a pressure of 28 Pa and a power of 300 W for 30 seconds. A control sample (A1) was additionally coated with CFx in the March Asher using $CHF_3$ at a flow of 10 SCCM, a pressure of 36 Pa, and a power of 100 W for 10 seconds. A second control sample (A2) was not coated with any CFx. A third sample (A3) was placed in the dielectric barrier discharge cell. A mixture of helium, CF4 and $CHF_3$ was established by flowing 8 slm, 0.1 slm (nominal), and 0.005 slm (nominal) of the respective gases into the discharge cell. After purging the cell for 30 minutes, a 450 kHz (rf) high-voltage sinusoidal waveform was applied to the ITO-coated electrode, and a discharge was struck with a power of 30–40 W. After 20 seconds, the rf power was shut off. The cell was purged with helium, and the sample was then removed. A fourth sample (A4) was placed in the dielectric barrier discharge cell. A mixture of helium and CF4 was established by flowing 8 slm and 0.1 slm of the respective gases into the discharge cell. After purging the cell for 30 minutes, a 450 kHz (rf) high-voltage sinusoidal waveform was applied to the ITO-coated electrode, and a discharge was struck with a power of 30–40 W. After 10 seconds, the rf power was shut off. The cell was purged with helium, and the sample was then removed. All four of these samples were then coated with a hole transport layer (NPB, 75 nm), an electron transport layer (A1Q, 75 nm), and a patterned cathode (Mg/Ag 10/1). The light-emitting diode devices (standard cells) thus made were then characterized with respect to light emission, current-voltage characteristics, and lifetime. Additional samples made with substantially higher $CHF_3$ flows (0.05 slm) and or longer discharge times (60 secconds) did not light adequately to be characterized and thus serve as comparative examples illustrating the effects of excessive $CHF_3$ content in the process gas and/or excessive process times.

The results are presented in Table 1. As can be seen from the table, the samples produced by using the atmospheric pressure discharge to generate the CFx layer have comparable luminance, comparable drive voltage, and comparable lifetime to the sample produced using the vacuum plasma CFx process. All of these samples have substantially better lifetimes than the one made without any CFx layer.

TABLE 1

| Sample | Description | Treatment time (sec) | Gas Flows (slm) | | | Drive Voltage @ 20 mA | Relative lifetime (normalized to control 2) | Initial Luminance (cd/m$^2$) @ 80 mA/cm$^2$ |
| --- | --- | --- | --- | --- | --- | --- | --- | --- |
| | | | He | CHF3 (nominal flow) | CF4 (nominal flow) | | | |
| A1 | Control 1: Vacuum plasma CFx | N/A | N/A | N/A | N/A | 8.6 | 7.45098 | 2140 |
| A2 | Control 2: No CFx | N/A | N/A | N/A | N/A | 8.8 | 1 | 2400 |
| A3 | CHF3/Helium | 20 | 8 | 0.005 | 0.1 | 9.1 | 5.960784 | 2480 |
| A4 | CF4/Helium | 10 | 8 | 0 | 0.1 | 8.7 | 6.10049 | 2620 |

Example 2

Another series of samples was prepared similarly to samples A3 and A4 above, except that no vacuum plasma oxygen treatment was carried out prior to dielectric barrier discharge treatment. Instead, a helium oxygen mixture was admitted to the dielectric barrier discharge chamber and discharge treatments were carried out at 30–40 W for the times indicated in Table 2 (samples B1–B4). The oxygen was then shut off, and helium-CF$_4$ or helium-CF$_4$-CHF$_3$ mixtures were established at the flows indicated in Table 2. After purging, a discharge treatment in the fluorocarbon bearing gas mixture was carried out at 30–40 W for 10 seconds. In each case, after all treatments were complete, the chamber was purged with helium and the sample was removed. The light-emitting diode devices thus made were then characterized with respect to light emission, current-voltage characteristics, and lifetime. Additional samples made with substantially lower oxygen flows (0.01 slm) during helium-oxygen discharge treatment or longer treatment times (20 s) during CFx treatment did not light adequately to be characterized and thus serve as comparative examples illustrating the effects of oxygen content in the oxygen treatment process gas and/or excessive CFx treatment process times subsequent to oxygen treatment. As can be seen from Table 2, combinations of oxygen treatment and CFx treatment process conditions can be found that show considerable improvement over control 2.

Example 3

Yet another series of samples was prepared similarly to samples B1–B4 above, except that a single dielectric barrier discharge process was used to perform simultaneous oxygen and CFx treatment. A helium-oxygen-fluorocarbon mixture (indicated in Table 3 for samples C1–C3) was admitted to the dielectric barrier discharge chamber, and discharge treatments were carried out at 25–30 W for 10 seconds. In each case, after all treatment was complete, the chamber was purged with helium and the sample was removed. As can be seen in Table 3, using the single dielectric barrier discharge process with both oxygen and fluorocarbon present resulted in improved device lifetime relative to the control sample (A2) having no CFx. Furthermore, samples C1–C3 had comparable luminance and drive voltage to the samples produced using vacuum plasma treatments.

TABLE 2

| Sample | Description | Oxygen Treatment Process | | | CFx treatment Gas Flows | | | Drive Voltage @ 20 mA | relative lifetime (normalized to control 2) | Initial Luminance (cd/m$^2$) @ 80 mA/cm$^2$ |
| --- | --- | --- | --- | --- | --- | --- | --- | --- | --- | --- |
| | | He flow (slm) | O2 flow (slm) | t (sec) | He | CHF3 (nominal flow) | CF4 (nominal flow) | | | |
| B1 | No CHF3 120 s | 7 | 0.05 | 120 | 8 | 0 | 0.1 | 8.2 | 1.12 | 2210 |
| B2 | No CHF3 30 s | 7 | 0.05 | 30 | 8 | 0 | 0.1 | 7.8 | 4.47 | 1980 |
| B3 | No CHF3 15 s | 7 | 0.05 | 15 | 8 | 0 | 0.1 | 8.7 | 0.98 | 2190 |
| B4 | With CHF3 15 s | 7 | 0.05 | 15 | 8 | 5 | 0.1 | 8.6 | 1.92 | 2330 |

TABLE 3

| | | | CFx/Oxygen treatment Gas Flows | | | | | |
|---|---|---|---|---|---|---|---|---|
| Sample | Description | He | CHF3 (nominal flow) | CF4 (nominal flow) | O2 | Drive Voltage @ 20 mA | relative lifetime (normalized to control 2) | Initial Luminance (cd/m$^2$) @ 80 mA/cm$^2$ |
| C1 | No CHF3 | 8 | 0 | 0.1 | 25 | 8.9 | 1.43 | 2490 |
| C2 | No CF4 | 8 | 5 | 0 | 50 | 8.5 | 2.53 | 2470 |
| C3 | CF4 and CHF3 | 8 | 5 | 0.1 | 25 | 9.2 | 1.88 | 2540 |

Example 4

Patterned ITO-coated glass substrates (as used in the previous examples) were processed using the dielectric barrier discharge process employed for sample A3 in Example 1. Sample D1 was treated for 10 seconds. A second sample D2 was treated for 60 seconds. The processed samples were not further coated with OLED device layers, but instead were analyzed using X-ray photoelectron spectroscopy (XPS), using a monochromatic source of x-rays (Al Kα). Chemical composition was determined using an electron take-off angle of 45° C. At this analysis angle, the surface is probed to a depth of roughly 50 A. Analysis was performed in areas where no ITO was present (glass area) and in areas where the ITO was present (ITO area). Because the fluorocarbon layers are very thin, the chemical composition information is related to the layer thickness (i.e., the total fluorine and carbon atomic concentrations are indicative of the layer thickness, as the underlying indium and tin in the ITO or silicon and oxygen in the glass contribute significantly to the XPS signal at the 45 degree take-off angle). In addition, angle-dependent XPS was used to assess the thickness of the resultant fluorocarbon layer. As can be seen from the data in Table 4, the chemical composition data and the estimated layer thicknesses are well correlated. Furthermore, the data show considerably more fluorocarbon is deposited on the ITO regions than on the glass regions (roughly a factor of 4). In addition, the data show that the thickness does not increase appreciably with exposure time, indicating that a steady state layer thickness is achieved. It should be noted that other treatments carried out with no CF$_4$ and significantly higher concentrations of CHF$_3$ produced deposits of fluorocarbon that increased in thickness with time and were significantly thicker than observed for samples D1 and D2. Both the self-limiting thickness and the selective deposition are advantageous to production processes. The self-limiting thickness potentially affords some process latitude with respect to time, and the selective deposition provides the potential to perform CFx deposition without the need for masking the regions of glass where CFx deposition is undesirable. Example 4 shows a process wherein the fluorocarbon layer is selectively deposited on the conductive electrode or conductive electrode structure formed on a substrate. Additional process refinements can be readily imagined, such as a post CFx cleaning or a post-deposition etch to remove fluorocarbon residue from areas where its presence is undesirable such as on non-ITO-coated areas. It is also envisioned to combine the process wherein the fluorocarbon layer is selectively deposited on the conductive electrode with a patterned electrode in the atmospheric pressure processing station (chamber) to further reduce the deposition fluorocarbon residue from areas where its presence is undesirable such as in the non-ITO-coated areas outside the active device area of a substrate.

TABLE 4

| Sample ID | He/CHF3/CF4 gas mix (slpm) | Time (s) | Sample description | atom % F + C | A Thickness (from XPS) |
|---|---|---|---|---|---|
| D1 | 8/0.005/0.1 | 10 | ITO area | 54.84 | 21.936 |
| D1 | 8/0.005/0.1 | 10 | glass area | 13.22 | 5.288 |
| D2 | 8/0.005/0.1 | 60 | ITO area | 45.25 | 18.1 |
| D2 | 8/0.005/0.1 | 60 | glass area | 8.92 | 3.568 |

The invention has been described in detail with particular reference to certain preferred embodiments thereof including OLED devices, but it will be understood that variations and modifications can be effected within the spirit and scope of the invention such as employing the invention in other electronic devices.

| | PARTS LIST |
|---|---|
| 10 | liquids |
| 12 | oven |
| 14 | oxygen plasma process |
| 16 | flurocarbon deposition |
| 18 | coat devices |
| 20 | liquids |
| 22 | atmospheric pressure processing station |
| 23 | oven |
| 24 | oxygen plasma processing |
| 26 | fluorocarbon deposition |
| 28 | coat device |
| 30 | ITO/glass substrate |
| 32 | platen electrode |
| 34 | upper electrode |
| 36 | electrode-substrate gap |
| 38 | power feed |
| 40 | inlet |
| 42 | outlet |
| 44 | thermally insulating container |
| 46 | container top |
| 48 | electrode pair |
| 50 | upper electrode |

The invention claimed is:

1. In a method of making an electronic device in which a conductive electrode has been formed over a substrate, comprising:
    a) providing an oxidizing plasma in a processing station to modify the properties of the conductive electrode by using shaped and appropriately positioned plasma producing electrodes to produce the oxygen-containing plasma in the processing station; and
    b) producing a fluorocarbon plasma in the processing station to form a fluorocarbon layer over the modified conductive electrode and using the shaped electrodes to produce a spatially modulated fluorocarbon plasma in the chamber, which forms a fluorocarbon layer in selected areas of the substrate electrode structure including over the substrate electrode structure.

2. The method according to claim 1 wherein steps a)–b) are performed at pressures of 0.1 Bar or higher.

3. The method according to claim 1 further including the step of performing a post-deposition etch to remove fluorocarbon residue from areas where its presence is undesirable.

4. The method of claim 1 wherein the conductive electrode is ITO.

5. In a method of making an electronic device in which a conductive electrode has been formed over a substrate, comprising:
   a) providing an oxidizing plasma in a processing station at a pressure greater than 0.1 Bar to modify the properties of the conductive electrode by using appropriately positioned plasma producing electrodes to produce the oxygen-containing plasma in the processing station; and
   b) producing a fluorocarbon plasma in the processing station at a pressure greater than 0.1 Bar to form a fluorocarbon layer over the modified conductive electrode by selecting a mixture of gases including a fluorocarbon-bearing gas and hydrogen containing gas which will cause a thicker deposition of the fluorocarbon layer over the electrode than regions adjacent to the electrodes.

6. The method according to claim 5 wherein the mixture of gases contains hydrogen, a noble gas and at least one fluorocarbon gas which does not contain hydrogen.

7. The method of claim 5 wherein the gas wherein the fluorocarbon-bearing gas contains $CF_4$ and $CHF_3$.

8. The method of claim 5 wherein the electrode is ITO.

* * * * *